United States Patent [19]

Levy et al.

[11] Patent Number: 4,779,052
[45] Date of Patent: Oct. 18, 1988

[54] MULTICONDUCTOR TELEPHONE CABLE TEST APPARATUS

[75] Inventors: Sidney Levy, Belle Mead; Nicholas T. Stancati, Mountainside, both of N.J.

[73] Assignee: Thomas & Betts Corporation, Bridgewater, N.J.

[21] Appl. No.: 796,389

[22] Filed: Nov. 8, 1985

[51] Int. Cl.⁴ .................................... G01R 31/08
[52] U.S. Cl. ............................. 324/542; 324/556
[58] Field of Search ............... 324/51, 52, 54, 66, 324/556, 539–542; 379/24–26, 164, 396, 21, 120; 178/63 R

[56] References Cited

U.S. PATENT DOCUMENTS

| Re. 31,728 | 11/1984 | Simmonds | 179/175.3 |
|---|---|---|---|
| 3,778,801 | 12/1973 | Nudelmont | 340/253 |
| 3,792,205 | 2/1974 | O'Dea | 379/21 |
| 3,818,329 | 6/1974 | Reaves, Jr. | 324/66 X |
| 3,826,977 | 7/1974 | Woodworth | 324/556 |
| 3,982,180 | 9/1976 | Vaiden | 324/66 X |
| 4,055,733 | 10/1977 | Holsinger et al. | 179/175.3 |
| 4,074,187 | 2/1978 | Miller et al. | 324/66 X |
| 4,101,740 | 7/1978 | Barselloto | 379/164 X |
| 4,326,162 | 4/1982 | Hankey | 324/51 |
| 4,384,249 | 5/1983 | Medina | 324/66 X |
| 4,418,312 | 11/1983 | Figler et al. | 324/52 |
| 4,445,486 | 4/1984 | Bulatao | 324/66 |
| 4,471,293 | 9/1984 | Schnack | 324/51 |
| 4,524,320 | 6/1985 | Brooks | 324/66 |
| 4,536,703 | 8/1985 | Jablway et al. | 324/52 |
| 4,553,085 | 11/1985 | Canzano | 324/66 X |
| 4,564,728 | 1/1986 | Romano | 179/175.3 |
| 4,575,588 | 3/1986 | VandeVyuer | 324/66 X |
| 4,578,636 | 3/1986 | Bakke et al. | 324/66 |

FOREIGN PATENT DOCUMENTS 2644134  4/1984  Fed. Rep. of Germany ........ 324/66

OTHER PUBLICATIONS

Locators Short Form Catalog—6 pp.—7/82.
Harris Telecommunications Tools—8 pp.—1984.

Primary Examiner—Reinhard J. Eisenzopf
Assistant Examiner—Warren S. Edmonds
Attorney, Agent, or Firm—Robert M. Rodrick; Salvatore J. Abbruzzese

[57] ABSTRACT

Test apparatus for evaluation of multiconductor cable assemblies inlcude plural diverse indicators for each dedicated conductor pair and is responsive to single operator input to selectively drive the indicators for indication of proper cable assembly condition, conductor shorts, open assembly condition, and connection polarity reversal per assembly pair.

8 Claims, 6 Drawing Sheets

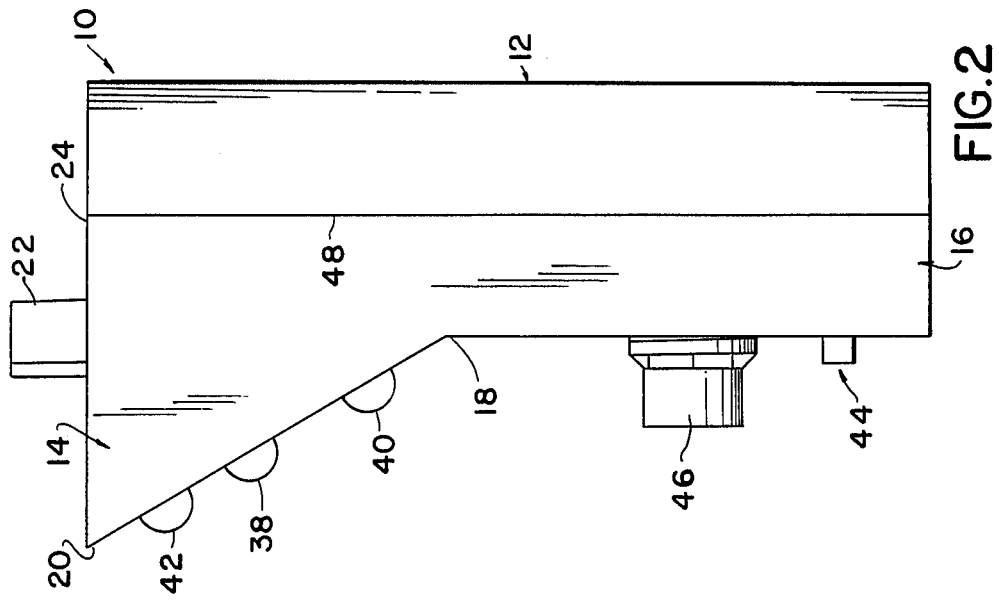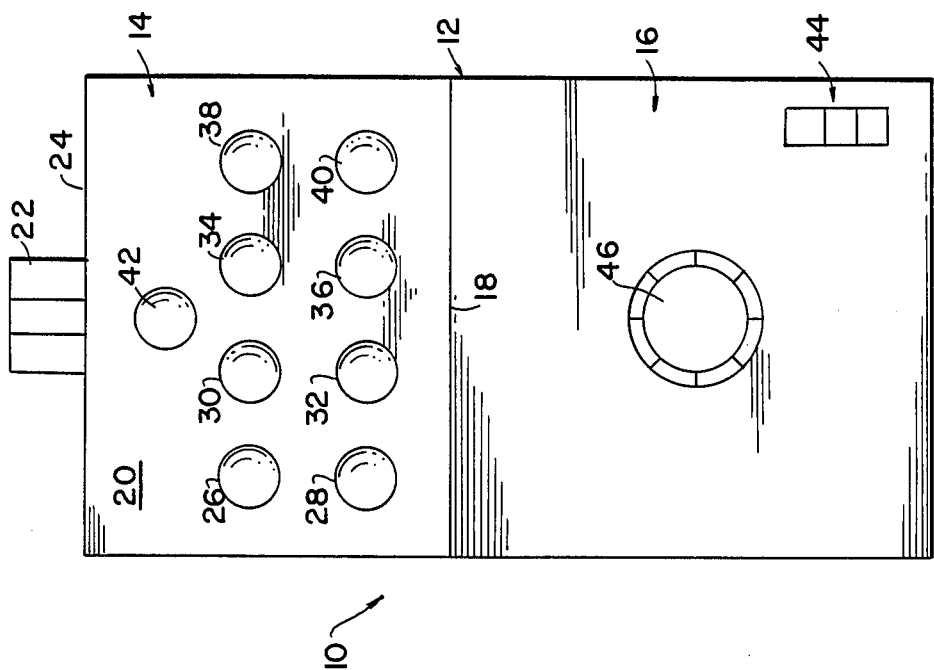

MULTICONDUCTOR TELEPHONE CABLE TEST APPARATUS

FIELD OF THE INVENTION

This invention relates generally to the examination of multiconductor cables for faults therein and pertains more particularly to apparatus for the detection of one or more diverse types of faults in multiconductor telephone cable assemblies.

BACKGROUND OF THE INVENTION

Telephone cable assemblies typically include multiple conductors terminated by modular plugs at ends thereof, the modular plugs having become standardized in such configuration as have jacks for releasable receipt of such plugs. Cables may comprise three, four or more pairs of conductors and the conductors are dedicated or preassigned in pairs. The plugs and jacks have contacts corresponding in number to the number of cable conductors and assigned likewise in pairs for communication purposes.

The cable plugs and associated telephone device jacks are mutually polarized, such that the cable assembly assigned pairs correspond on mating with circuitry connected to the jacks. All of this is seen also in the customary telephone set and associated cable in the average household. Given the jack and plug polarization, it is generally where errors exist in the cable or in its interconnection with its terminating plugs that error conditions exist in the telephone system.

As the art has long known, various errors can be present. Thus, the cable assembly conductors can be shorted to one another, individual cable assembly conductors or their terminations can be electrically discontinuous or open, or an individual cable assembly conductor pair can have its connections reversed at one end (polarity reversal within the pair).

Quite numerous varieties of telephone test apparatus are set forth in domestic and foreign patents and in commercial forms, such as is shown in the statement filed herein pursuant to 37 CFR 1.97 and 1.98. From applicants' viewpoint, such apparatus does not effect the required, known test functions in manner sufficiently expeditious to meet the needs of the industry.

SUMMARY OF THE INVENTION

The present invention has as its primary object the provision of improved apparatus for the detection of faults which may exist in multiconductor cable assemblies.

A more particular object of the present invention is the provision of improved apparatus for the examination of faults in telephone cable assemblies, specifically to enhance operator determination of conductor shorts, conductor open condition, reverse conductor connection per assigned conductor pair, and proper cable assembly condition.

In attaining the foregoing and other objects, the invention provides apparatus for testing a multiconductor cable assembly having preassigned conductor pairs and including first and second cable connectors having contacts terminating such conductors, the apparatus comprising first and second connectors for releasable receipt of the cable connectors and having corresponding contacts. The apparatus second connector has circuitry for unidirectional current conduction between selected pairs of such contacts thereof. Circuit means is connected to the apparatus first connector for providing output indication of any one or more of plural fault conditions which may exist in the cable.

The test apparatus preferably includes a housing supporting the apparatus first connector and the apparatus second connector is desirably portable relative to the housing. The circuitry of the apparatus second connector may include a plurality of diodes, each diode being connected serially between a pair of the contacts of the apparatus second connector.

In other aspects, the invention provides that the circuit means includes first and second mutually diverse indicators, such first indicators being connected individually in electrical series circuit with selected of the contacts of the apparatus first connector, such second indicators being connected individually in electrical series circuit with others of the contacts of the apparatus first connector.

Each such first indicator may comprise a diode connected individually to one of such selected first apparatus connector contacts and energizable to emit first color light and each such second indicator may comprises a diode connected individually to one of such other apparatus first connector contacts and energizable to emit second color light, different from such first color light.

In effecting its diverse cable fault condition indications, the circuit means further includes a diode in parallel reverse polarity connection with each such light-emitting diode (LED), a diode in series connection with each such light-emitting diode and connected with a source of voltage of preselected potential, and a diode in series connection with each such light-emitting diode and connected with a source of voltage different from such preselected potential.

In use of the apparatus of the invention, one connects one cable connector (plug) to the apparatus first connector (jack) and connects the other cable connector (jack) to the apparatus second connector (test plug). In response to single operator input to the apparatus circuit means, a "scan" switch input, the apparatus responds without further operator input to assess the condition of the connected cable, i.e., to provide output indication of conductor shorts and opens, pair polarity problems, or no problems at all in the cable.

Where the first indicators are green LEDs and the second indicators are red LEDs, the cable is found satisfactory if the green light output occurs in sequence correspondence to the cable conductors. A short condition is indicated when a green LED and a red LED are alternately illuminated. Open wires are indicated by the failure of the corresponding LED to illuminate. If only a red lamp of a pair illuminates, the condition output is that of the reversal of polarity of the conductor pair.

The foregoing and other objects and features of the invention will be further understood from the following detailed description of preferred embodiments thereof and from the drawings wherein like reference numerals identify like parts and components throughout.

DESCRIPTION OF THE DRAWINGS

FIG. 1 is a top plan view of test apparatus in accordance with the invention.

FIG. 2 is a right side elevational view of the test apparatus of FIG. 1.

DETAILED DESCRIPTION OF PREFERRED EMBODIMENTS

Figures 3, 4:
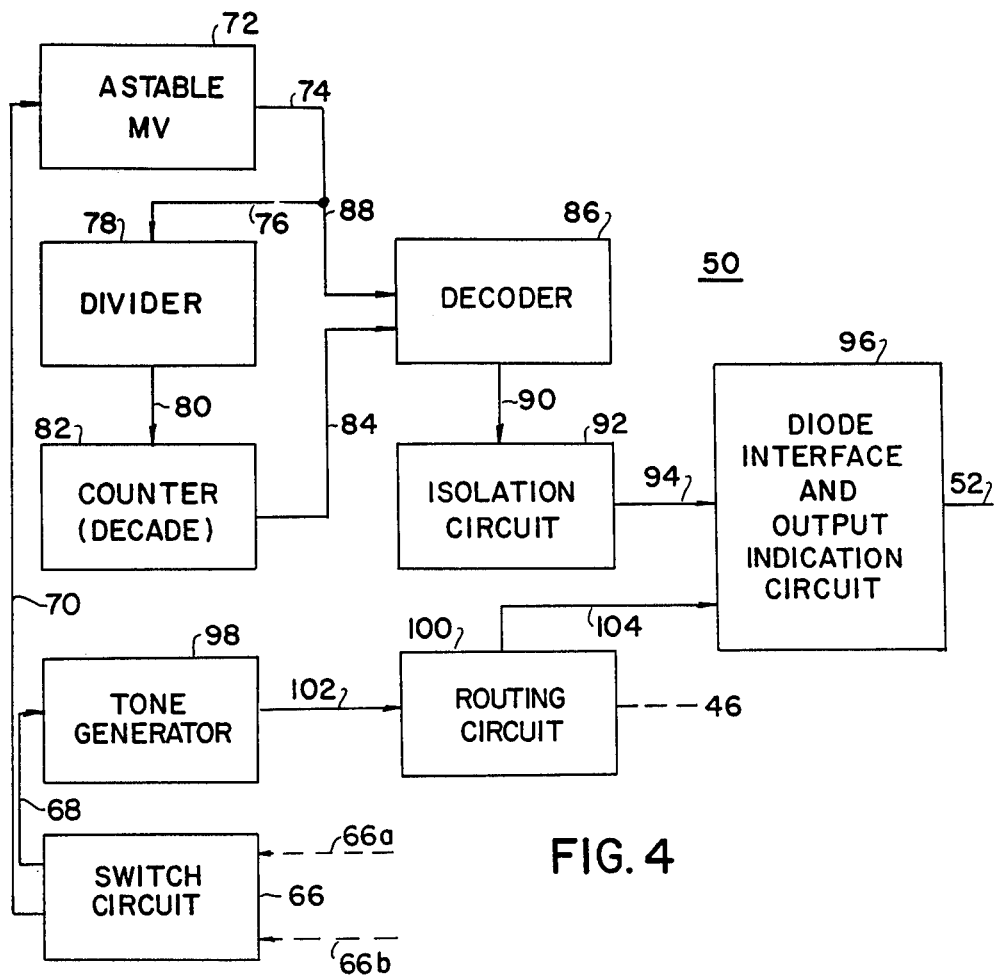
FIG. 3 is a general block diagram of the system of the FIG. 1 test apparatus in combination with a cable to be tested thereby.
FIG. 4 is a detailed block diagram of the system of the FIG. 1 test apparatus, absent its apparatus second connector circuitry.

Referring to FIGS. 1 and 2, test apparatus 10 includes a generally rectangular housing 12 having upper portion 14 and lower portion 16, intersecting at line 18. Portion 14 is tapered upwardly of portion 16 along facing surface 20 thereof. Apparatus first connector 22 extends outwardly of rear wall 24 of housing 12, and is configured in the manner of the customary commercial telephone jack, above noted.

In the FIG. 1 embodiment of apparatus 10, the exemplary intent is to provide for the examination of a four-pair telephone cable assembly and hence four pairs of light-emitting diode units are supported on surface 20 of upper portion 14, comprising respective diverse green and red LED units 26 and 28, 30 and 32, 34 and 36, and 38 and 40. A further LED 42, desirably of a further different color, such as yellow, may be disposed above the noted LED pair grouping to indicate that the cable assembly being tested has power applied thereto, LED 42 being illuminated under such condition.

Lower portion 16 of apparatus 10 supports mode selector switch 44 in its lower right, the switch having a central off position and being translatable upwardly to effect a "scan" mode and downwardly to effect a "tone" mode. In the latter mode, apparatus 10 includes a rotary selector switch 46, which is manually settable to any one of the eight cable assembly conductors in the given example.

Housing 12 of test apparatus 10 may be formed in half sections matable along line 48 (FIG. 2), separable for replacement of drycell batteries of the apparatus.

Turning now to FIG. 3, the general block diagram thereof shows the apparatus-housed system 50 or electronics of the test apparatus, connected by lines 52 to apparatus first connector or jack 22. Cable assembly first connector or plug 54 is releasably receivable and hence connectable to connector 22, as is indicated by mechanical line 56. The multiconductor cable 58 of cable assembly 60 is further terminated at its opposite end by cable assembly second connector (jack) 62, which is releasably receivable and hence connectable to apparatus second connector 64, as is indicated by mechanical line 63. In preferred version of the test apparatus of the invention, apparatus second connector 64, which may termed a test plug, is portable relative to housing 12, but, if desired, may be supported by housing 12. Alternatively, connector 62 may be a plug and connector 64 may be a jack.

The preferred circuitry of apparatus-housed system 50 is seen in principal part in FIG. 4. Switch circuit 66 is responsive to mechanical inputs as at 66a and 66b, respectively for tone and scan modes of test apparatus operation, to energize either output line 68 or output line 70. In the case of line 70 energization (positive or HI d.c. voltage thereon), astable multivibrator 72 is activated to provide a train of pulses (LO-HI-LO-HI, etc. with time, where LO is a lesser d.c. voltage than HI, such as electrical ground) on line 74. Line 74 is connected by line 76 to divider 78, which down counts the line 74 pulses, to provide a lower rate pulse output on line 80 to counter 82, which in turn provides decade count outputs on lines 84 to decoder 86. The line 74 output of multivibrator 72 is furnished as a input to decoder 86 over lines 88.

Responsively to the states of the inputs thereto on lines 84 and lines 88 signal, decoder 86 selectively, sequentially activates its output lines 90 and such signals are conveyed through isolation circuit 92 to lines 94 which serve as inputs to diode interface and output indication circuit 96, which connects with lines 52 of FIG. 3.

Where line 68 is energized in tone mode operation, tone generator 98 is activated and, is connected by lines 102 to routing circuit 100. In accordance with the setting of routing circuit 100 by mode selector switch 46, the corresponding one of lines 104 is activated and the generated tone is conducted to circuit 96.

The tone mode subsystem will be seen as essentially separate in circuitry from the scan mode subsystem, and fully separate in function. The tone mode subsystem may accordingly be omitted from the tester in practicing the invention, in which case, the need for isolation circuit 92 is not present, and lines 90 and 94 of FIG. 4 may be directly interconnected.

Figure 5:
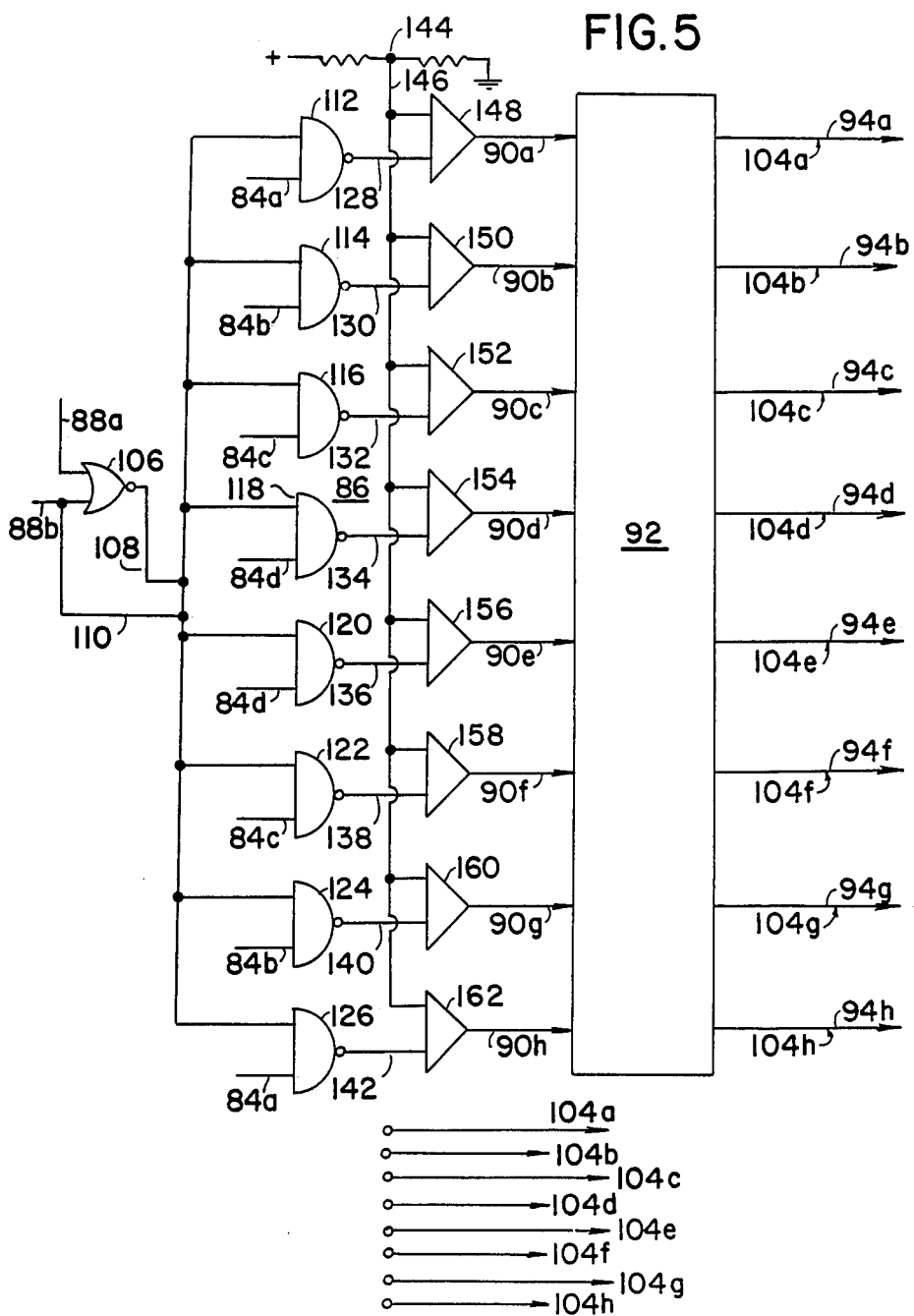
FIGS. 5 and 6 are electrical schematic diagrams of portions of the system of the FIG. 1 test apparatus.

Turning now to FIG. 5, decoder 86 of system 50 of FIG. 4 includes NOR gate 106, inputs to which on lines 88a and 88b. from multivibrator 72 cause lines 108 and 110 to be alternately energized. Line 108 provides one input to NAND gates 112, 114, 116 and 118. Counter 82 of FIG. 4 provides second inputs to these NAND gates over lines 84a, 84b, 84c and 84d, (lines 84 of FIG. 4) respectively. Line 110 provides one input to NAND gates 120, 122, 124 and 126. Lines 84d, 84c, 84b and 84a provide respective second inputs to these NAND gates.

As will be seen, when line 108 is energized, output lines 128, 130, 132 and 134 of NAND gates 112, 114, 116 and 118 will be energized in sequence corresponding to the sequential energization of counter output lines 84a, 84b, 84c and 84d.

Likewise, when line 110 is energized, output lines 142, 140, 138 and 136 of NAND gates 126, 124, 122 and 120 will be energized in sequence corresponding to the sequential energization of counter output lines 84a, 84b, 84c and 84d.

A resistive voltage divider is shown at 144 and applies a positive voltage to line 146, which is connected in common to first inputs of operational amplifiers 148 through 162. Second inputs to these amplifiers are provided by lines 128 through 142. The amplifier outputs are applied to lines 90a through 90h and thence, through isolation circuit 92 to lines 94a through 94h. The sequence of energization of lines 94 will be: 94a; 94h; 94b; 94g; 94c; 94f; 94d and 94e.

To complete discussion of the FIG. 5 circuitry, the output of tone generator 98 of FIG. 4 will be routed individually to the one of lines 104a through 104h to which switch 46 is set at that time. Connections are made, as in FIG. 5 from lines 104a through 104h correspondingly to lines 94a through 94h. Customary tone checkout of cable assembly conductors may thus be effected.

Figure 6:
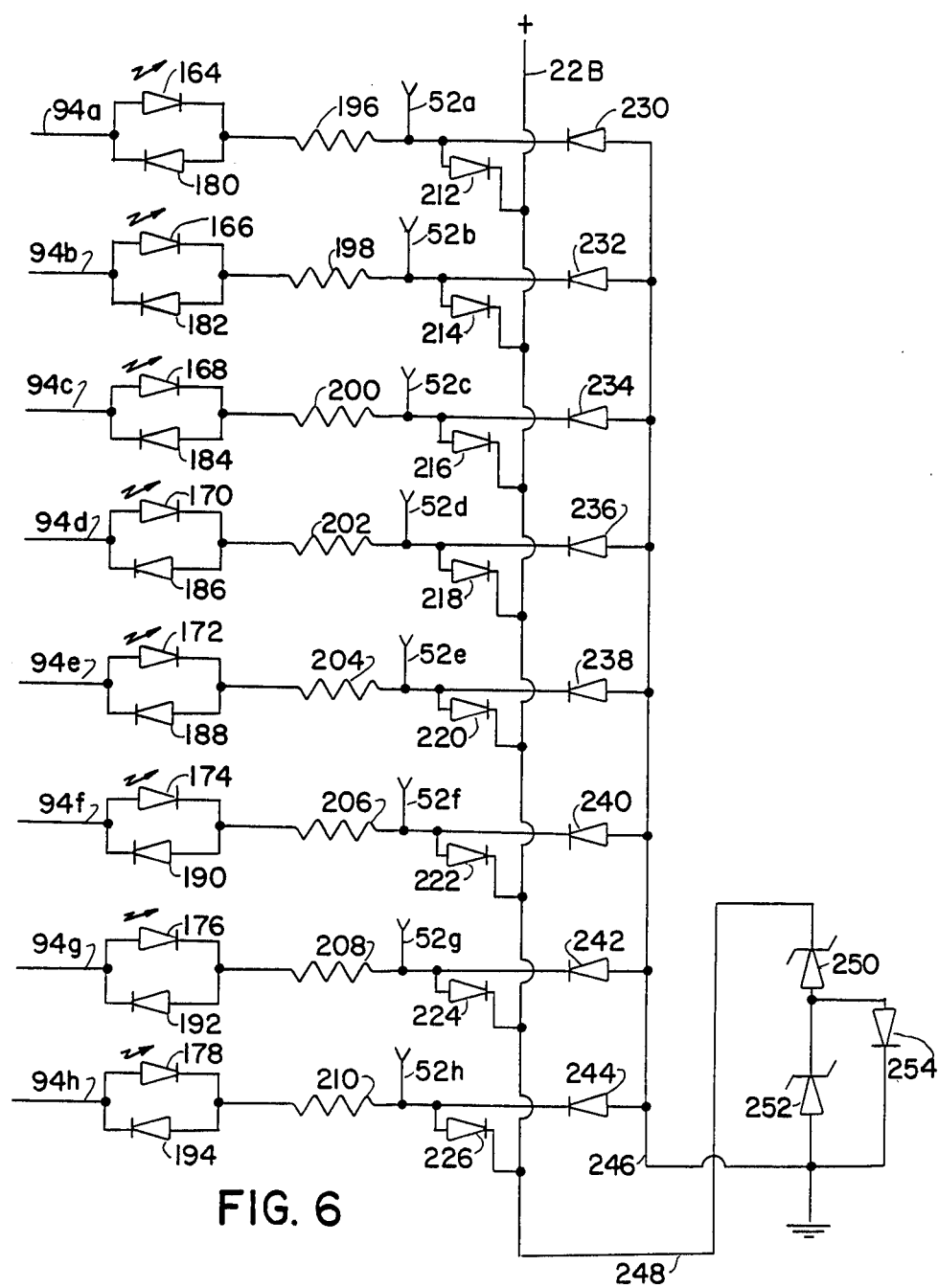

Turning now to FIG. 6, a circuit embodiment of diode interface and output indication circuit 96 of FIG. 4 is shown. Diodes 164, 166, 168 and 170 are green LEDs and have their anodes connected to lines 94a-94d, respectively. Diodes 172, 174, 176 and 178 are red LEDs and have their anodes connected to lines 94e-94h, respectively. Non-LED diodes 180-194 are connected in reverse polarity across LEDs 164-178. The cathodes of LEDs 164-178 are individually series-connected through resistors 196-210 for connection to the anodes of non-LED diodes 212-226, whose cathodes are connected in common to positive voltage by line 228, and for connection to the cathodes of non-LED diodes 230-244, the anodes of which are connected in common to electrical ground by line 246.

Lines 52a-52h extend, as shown in FIG. 6 from junctions with resistors 196-210, to connection with the contacts of tester jack 22 of FIGS. 1 and 3.

Line 248 connects with line 228 to apply positive voltage to the cathode of Zener diode 250, whose anode is connected to the cathode of Zener diode 252 and the anode of LED 254. The anode of Zener diode 252 and the cathode of LED 254 are grounded. The operation of this segment of the FIG. 6 circuitry can be stated summarily. The voltage on line 228 is normally not of a sufficient magnitude to break down both Zener diodes 250 and 252. However, when any one of lines 52a-52h has "hot line" voltage therein, LED 254 is energized through the corresponding one of diodes 212-226, by breakdown of Zener diodes 250 and 252.

Figure 7:
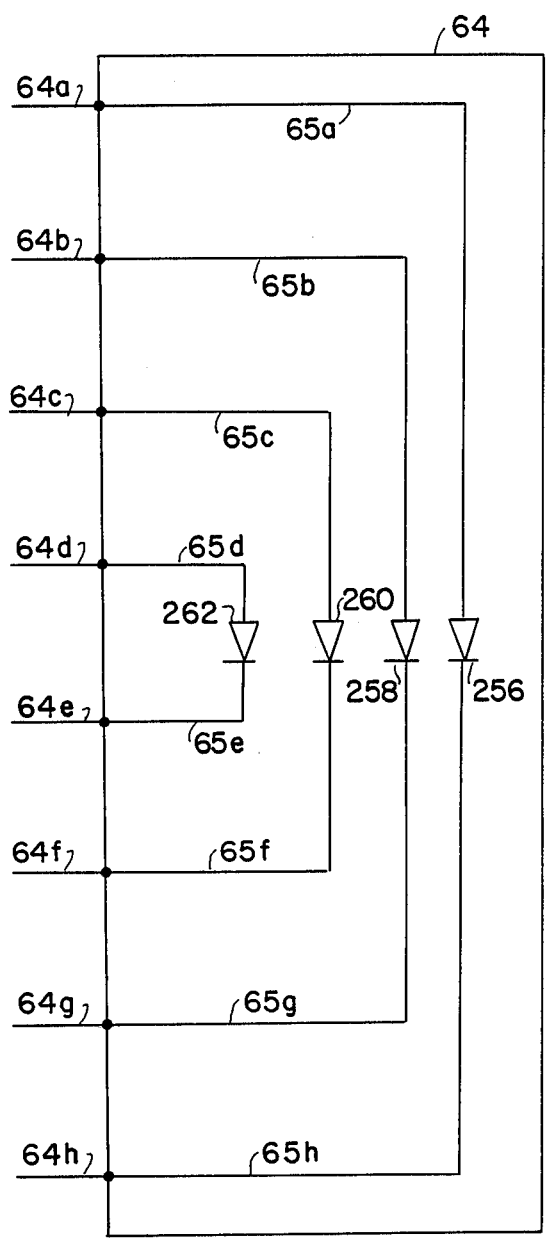
FIG. 7 is an electrical schematic diagram of one version of an apparatus second connector in accordance with the invention.

Prior to further discussion of the operation of the circuitry of FIG. 6, it will be helpful to cover the circuitry of FIG. 7, which is that of apparatus second connector or test plug 64 of FIG. 3.

Reference numerals 64a through 64h of FIG. 7 represent the contacts of test plug 64, which will mate with corresponding contacts of cable assembly jack 62 (FIG. 3). Conductors 65a and 65h have non-LED diode 256 series-connected therewith and hence across contacts 64a and 64h. Conductors 65b and 65g and diode 258 likewise bridge contacts 64b and 64g. Conductors 65c and 65f connect diode 260 across contacts 64c and 64f and conductors 65d and 65e place diode 262 across contacts 64d and 64e. Diodes 256-258 are thus assigned individually to cable assembly conductor pairs.

Figure 8:
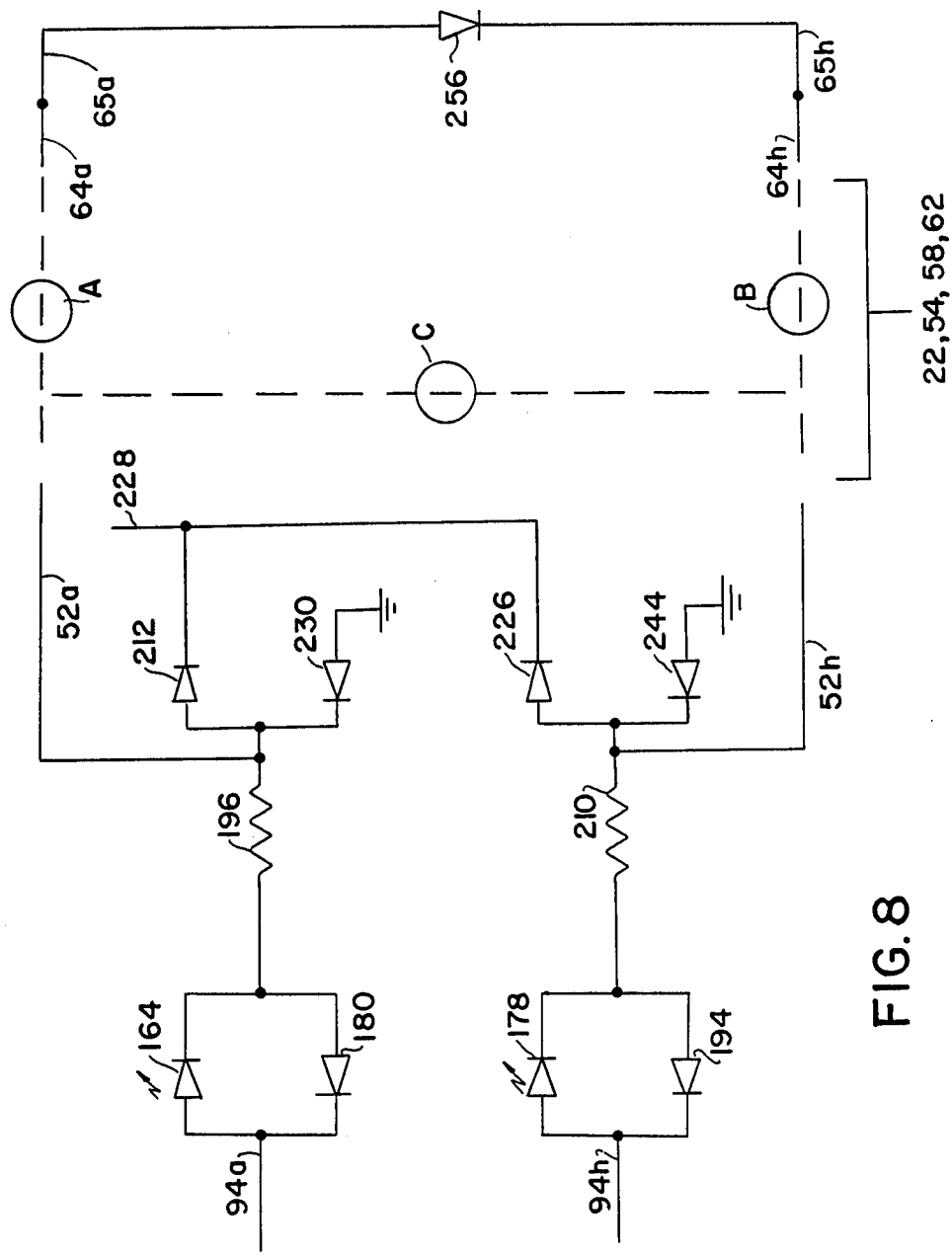
FIG. 8 is an electrical schematic diagram of the circuitry of FIG. 6 for one preassigned pair of conductors of a cable assembly and the corresponding circuitry of FIG. 7 of the apparatus second connector associated therewith.

In FIG. 8, that portion of the FIG. 6 circuitry is shown relating to the examination of the cable assembly conductor pair connected electrically to lines 52a and 52h. This conductor pair is shown terminated by contacts 64a and 64h, lines 65a, 65h and diode 256 from FIG. 7. Circles A, B and C are intended respectively to show an open in one of the conductors of such cable assembly pair, an open in the other of the conductors of such cable assembly pair, and a short circuit between the conductors of such cable assembly pair.

As a first cable assembly condition, the cable assembly pair is assumed to be properly connected and without conductor opens or conductor shorts, i.e., circles A, B and C do not apply. As line 94a is energized (goes HI), green LED 164 is illuminated through resistor 196, line 52a, contact 64a, line 65a, diode 256, line 65h, contact 64h, line 52h, resistor 210 and diode 194, line 94h being LO.

When line 94h goes HI, sequential to the line 94a HI, red LED 178 is not illuminated, since the reverse path to that described is not electrically continuous, diode 256 being in reverse polarity in such path.

Referring back to FIG. 6, and assuming all cable assembly conductor pairs to be without opens or shorts, the green LEDs will thus be sequentially illuminated (164, 166, 168 and 170) and none of the red LEDs will be illuminated. Same provides collective output indication of a proper cable assembly.

As a second cable assembly condition, the cable assembly pair of FIG. 8 is assumed to have an open at circle A, i.e., in one of its conductors. The other conductor of the pair is continuous (circle B is not applicable), and no conductor pair short is present (circle C is not applicable).

In this instance, green LED 164 is not illuminated as line 94a goes HI, since its energization path is open at circle A.

In a third cable assembly condition, the cable assembly pair of FIG. 8 is assumed to have an open at circle B, i.e., in the other of its conductors. Circles A and C are not applicable. Again, green LED 164 will not be illuminated as line 94a goes HI, since its energization path is open at circle B.

Referring back to FIG. 6, the failure of illumination of any one or more of green LEDs 164, 166, 168 and 170 will serve as an output indication of an open in either or both of the conductors of the conductor pairs thereof.

As a fourth cable assembly condition, the cable assembly pair of FIG. 8 is assumed to have a short, as at circle C.

In this instance, a bidirectional conductive path exists between lines 52a and 52h, bridging the otherwise unidirectionally conductive path provided by diode 256. Accordingly, as line 94a goes HI, green LED 164 is illuminated, and as line 94h goes sequentially HI, red LED 178 is illuminated.

Referring back to FIG. 6, and assuming the circle C conductor pair short to apply only in the case of the cable assembly conductor pair associated with lines 52a and 52h, the LED illumination sequence will be: LED 164 (green); 178 (red); LED 166 (green); LED 168 (green); and LED 170 (green); none of red LEDs 172, 174 and 176 being illuminated.

As a fifth cable assembly condition, the cable assembly pair of FIG. 8 is assumed to have its connection polarity reversed, e.g., whereby line 52a is connected to contact 64h and line 52h is connected to contact 64a.

In this instance, as line 94a goes HI, green LED 164 is not illuminated, since diode 256 is in reverse connection polarity in the connection path. However, as line 94h goes HI, red LED 178 is illuminated.

Referring back to FIG. 6, and assuming the pair polarity reversal to apply only to the cable assembly conductor pair associated with the FIG. 8 showing, the LED illumination sequence will be: LED 178 (red); LED 166 (green); LED 168 (green); and LED 170 (green); none of LEDs (all red) 172, 174 and 176 being illuminated.

Various other misconnections of a cable assembly will be evidenced by the test apparatus of the invention upon the failure of its proper cable condition test, which provides the sequential illumination of all participating green LEDs.

By way of example, assume the wires of intended pairs are mixed, such that lines 94a and 94b (FIG. 6) are terminated so as to be connected ultimately to test plug 64 contacts 64a and 64h. In this instance, green LED 164 will be illuminated, but green LED 166 will not be illuminated since diode 256 (FIG. 7) is reverse-connected therewith.

The other wires of such intended pairs will also be mixed in the example, and one thereof will be terminated such that diode 258 has its anode connected thereto. The red LED of such wire will accordingly be illuminated. Based on such observed lighting patterns, the user will note the presence of a misconnection and the nature thereof.

By way of illustrative components for making the tester of FIG. 4, astable multivibrator 72 may be of type NE555P, divider 78 may be of type CD4017P, as may counter 82, and tone generator 98 may be of type NE556P.

Various changes to the test apparatus and modifications to its described system may be introduced without departing from the invention. Thus, the particularly described preferred embodiments and practices are intended as illustrative and not in a limiting sense. The true scope of the invention is set forth in the following claims.

We claim:

1. A test apparatus for providing a visual indication of the existence of various electrical fault conditions in a multiconductor electrical cable assembly comprising:
   (a) a first plurality of LEDs energizable to provide output of one color;
   (b) a second plurality of LEDs energizable to provide output of other color different from said one color;
   (c) non-LEDs, each connected in parallel with a distinct one of said LEDs of said first and second pluralities and in reverse polarity therewith;
   (d) circuit means for individually sequentially applying voltage to said LEDs to provide such visual indication through said LEDs of the existence of said various fault conditions; and
   (e) connector means for releasable connecton with said cable assembly and in electrical connection with said LEDs,
   said first plurality LEDs and said second plurality LEDs being unenergized upon such voltage application thereto to indicate a first such fault condition, said first plurality LEDs and said second plurality LEDs being sequentially energized upon such voltage application thereto to indicate a second such fault condition, and an exclusive one plurality of said first plurality LEDs and said second plurality LEDs being sequentially energized upon such voltage application thereto to indicate a third such fault condition, said non-LEDs conducting current therethrough selectively in the course of such energization of said first plurality LEDs and said second plurality LEDs.

2. The invention claimed in claim 1 further including a housing for support of such items (a) through (e), and said connector means including a element for releasable connection with said cable assembly and portable with respect to said housing.

3. The invention claimed in claim 2 wherein such said portable connector element includes circuitry for selectively interconnecting pairs of conductors of said cable assembly.

4. The invention claimed in claim 3 wherein said circuitry comprises means for unidirectionally interconnecting the conductors of each such conductor pair.

5. The invention claimed in claim 4 wherein each such unidirectional interconnecting means comprises a diode.

6. Apparatus for testing a multiconductor cable assembly having preassigned conductor pairs; said apparatus comprising:
   (a) plural diverse indicators for each conductor pair, said indicators being electrically connectable in series with said cable assembly and
   (b) circuit means for connection to said indicators and to said cable assembly and responsive to single operator input to apply voltage sequentially to said indicators to provide display by said indicators of different cable assembly conditions by respective diverse energizations of said indicators and nonenergization thereof, inclusive of:
      (1) short circuits therein;
      (2) open circuits therein;
      (3) reverse connection polarity of a conductor pair; and
      (4) proper cable assembly condition; said apparatus including plural diode pairs having and LED connected across and in reverse polarity to a non-LED, said plural diverse indicators including said LEDs of said diode pairs, said non-LEDs being a part of said circuit means and conducting current selectively in the course of such condition display.

7. The invention claimed in claim 6 inclusive of a green LED and a red LED for each conductor pair.

8. The invention claimed in claim 1 wherein said other plurality of said first plurality LEDs and said second plurality LEDs is sequentially energized upon such voltage application to indicate absence of fault conditions in said cable assembly.

* * * * *